United States Patent [19]

Das

[11] 4,307,422
[45] Dec. 22, 1981

[54] RECEIVER ARRANGEMENT

[75] Inventor: Tapan K. Das, Swindon, England

[73] Assignee: Plessey Handel und Investments A.G., Zug, Switzerland

[21] Appl. No.: 75,107

[22] Filed: Sep. 13, 1979

[30] Foreign Application Priority Data

Sep. 15, 1978 [GB] United Kingdom ............... 37064/78

[51] Int. Cl.³ .............................................. H04N 5/44
[52] U.S. Cl. .................................. 358/193.1; 455/164
[58] Field of Search .................... 358/193.1; 455/169, 455/164

[56] References Cited

U.S. PATENT DOCUMENTS

| 3,715,495 | 2/1973 | Takezari et al. | 358/193.1 |
| 3,949,164 | 4/1976 | Murakami et al. | 358/193.1 |
| 3,967,057 | 6/1976 | Tsukamoto et al. | 358/193.1 |
| 4,159,487 | 6/1979 | Elshuber et al. | 358/193.1 |

Primary Examiner—Richard Murray
Attorney, Agent, or Firm—Fleit & Jacobson

[57] ABSTRACT

This application describes a receiver in which channel selection is controlled by a frequency synthesizer a sweep of available channels is made by a channel selecting arrangement and this sweep is arranged to be stopped when a signal is received. When the sweeping is stopped a fine tuning arrangement takes control to respond to the frequency of the received signal and to compensate for any drift of that signal.

18 Claims, 1 Drawing Figure

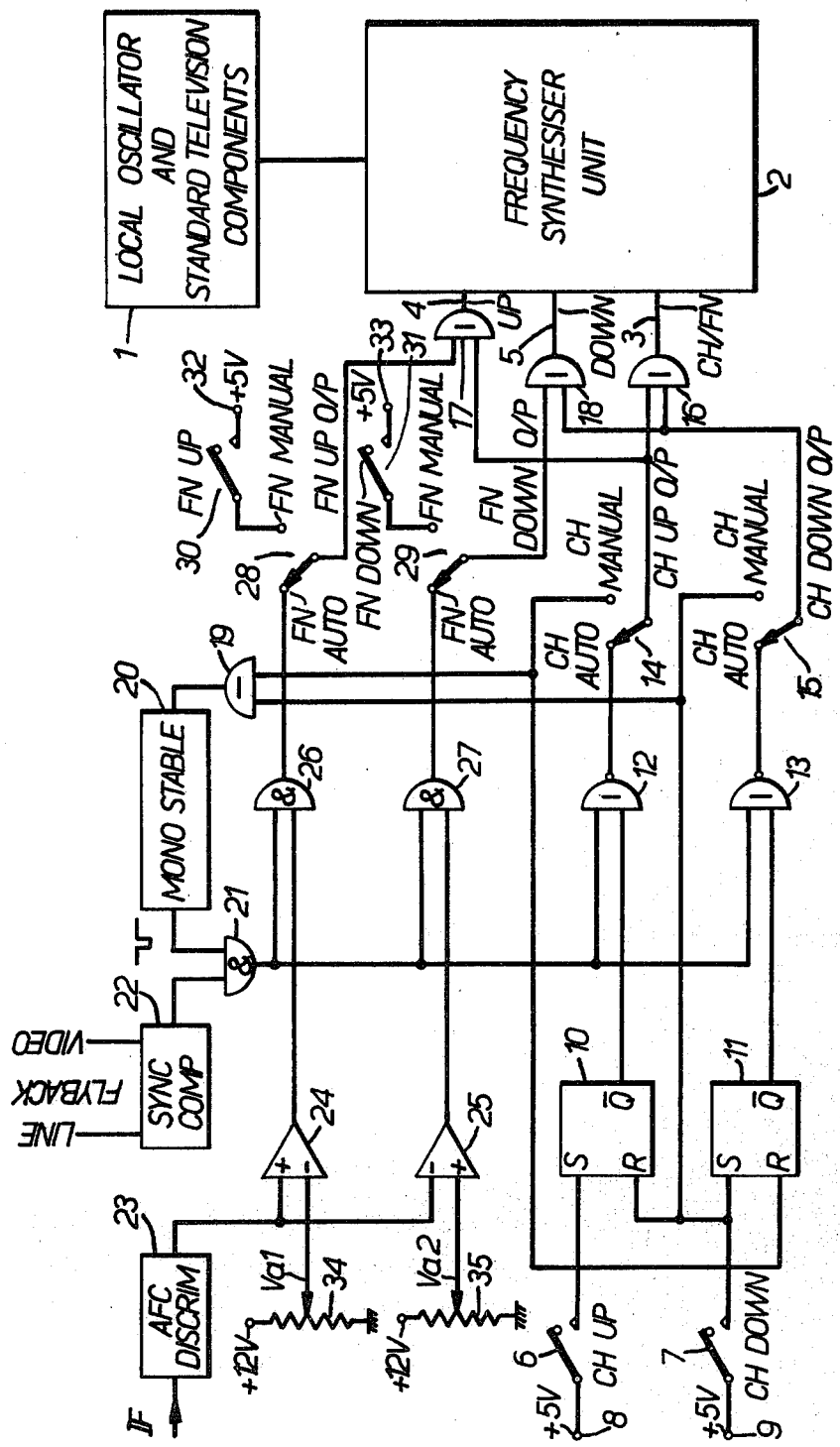

RECEIVER ARRANGEMENT

This invention relates to a receiver arrangement incorporating frequency synthesizer controlled channel selection. The invention is particularly although not exclusively applicable to a television receiver. The term channel is used herein in a general sense to refer to an available reception frequency.

In our co-pending G.B. patent application No. 32419/16 corresponding to U.S. Pat. No. 4,123,724 of Das et al, issued on Oct. 31, 1978, there is described a frequency synthesizer control arrangement suitable for use in a television receiver for effecting frequency control of its local oscillator for the purpose of channel selection.

In that application two methods of channel selection have been described. The first method is to select the channel number in a digital switch and then to enter the channel numbers by pressing the TUNE control.

The second method is to effect a sweep through the whole range of channel numbers until a required number is reached. In both methods fine tuning is effected by operation of the provided fine tune controls.

In the channel sweep tuning method disclosed, a user has to keep the tuning control operated until the required channel is reached at which point the control must be immediately released. This can be a disadvantage if the user is not familiar with the channel numbers of his area, he must watch the T.V. screen and release the control at the moment a picture appears.

This invention seeks to provide a receiver arrangement employing frequency synthesizer controlled channel selection in which the above mentioned disadvantage is mitigated.

According to this invention there is provided a receiver comprising frequency synthesizer controlled channel selection means which includes a fine tuning arrangement; means for initiating a sweep of available channels by the channel selection means; means for stopping the sweep on reception of a signal and means, operable on cessation of sweeping and responsive to the frequency of the signal, and arranged to control the fine tuning arrangement to compensate for frequency drift of the signal.

The receiver may be in the form of a television receiver.

The means operable a cessation of sweeping may comprise level detector means arranged to receive a signal whose level is representative of the frequency of the received signal and to provide an output signal when a predetermined frequency drift is detected.

In a preferred form two level comparators are provided each arranged to receive the frequency representative signal and a respective reference level and to provide an output respectively representative of an upward and downward frequency drift exceeding predetermined limits.

The signal whose level is representative of the frequency of the received signal may be provided by automatic frequency control (A.F.C.) means conveniently in the form of an A.F.C. discriminator.

The means operable or cessation of sweeping may be arranged to control the fine tuning arrangement via a signal path which includes means for blocking said signal path until the said signal is received.

The means for blocking may be in the form of gate means connected to the said signal path and arranged to receive a second input a signal indicative of the receipt of the said signal.

The means for initiating a sweep may comprise an operator control coupled to control input means of the channel selection means, and the means for stopping sweeping is operative to isolate the operator control from the said control input means.

The operator may be coupled to the channel selection means via gating means operative to open an operation of the operator control and the means for stopping sweeping may provide a signal operative to block the gating means or receipt of the said signal.

The means for stopping sweeping may include means for detecting the reception of the said signal which in a preferred form of television receiver comprises a sync comparator operative to compare video signals with line flyback signals and to provide an output signal whose level is indicitive of the reception of the said signal.

The invention will now be further described with reference to the accompanying single FIGURE drawing which shows schematically a television receiver in accordance with the invention.

Referring to the drawings there is shown a television receiver which has a local oscillator and other standard television components such as i.f. amplifier and sound and vision detection and reproduction circuits, all shown within rectangular box referenced 1. A frequency synthesizer unit 2 controls the frequency of the local oscillator in order to provide channel selection.

The frequency synthesizer unit 2 has a fine tuning arrangement and may conveniently be as described in our co-pending application No. 32419/76 corresponding to U.S. Pat. No. 4,123,724 of Das et al, issued on Oct. 31, 1978,.

The frequency synthesizer unit 2 is capable of effecting a sweep of available channels and has three inputs which correspond to inputs to the synthesizer described in the co-pending application. A first input 3 is a channel sweep/fine tuning input and when an appropriate signal level is applied to this input the frequency synthesizing unit 2 is caused to sweep through available reception channels. In the absence of a suitable signal level to the input 3 the frequency synthesizer unit 2 is only operative in the fine tune mode in a manner to be described.

The second and third inputs 4 and 5 are respectively up and down control inputs. The up and down control inputs 4 and 5 perform a dual function of indicating to the frequency synthesizer unit 2 during channel sweeping the direction in which sweeping is to be effective and also act as fine tuning signal inputs when the synthesizer is operating in the fine tuning mode.

To initiate sweeping two operator controls are provided in the form of push button switches 6 and 7 the switch 6 being a sweep up switch while the switch 7 is a sweep down switch. The switches 6 and 7 are operative to connect potentials applied at terminals 8 and 9 respectively to the SET input of flip-flops 10 and 11 respectively. The terminal 8 connected via the switch 6 to the SET input of the flip-flop 10 is also connected via the switch to the RESET input of the flip-flop 11 whilst the terminal 9 is similarily connected to the RESET input of the flip-flop 10 so that whenever one of the two flip-flops is SET the other is automatically RESET. Typically potentials of 5 volts are applied to the terminals 8 and 9.

The flip-flops 10 and 11 have Q outputs respectively connected to one input of NOR gates 12 and 13 which have outputs connected via one position of respective two position auto/manual switches 14 and 15 the wipers of which are connected to respective inputs of an OR gate 16 whose output is connected to the channel sweep/fine tuning input 3 of the frequency synthesizer unit 2. The wiper of the switch 14 is also connected to one input of an OR gate 17 whose output is connected to the input 4 of the synthesizer unit 2 whilst the wiper of the switch 15 is connected to one input of an OR gate 18 whose output is connected to the input 5 of the synthesizer unit 2.

In the second position of each switch 14 and 15 the potentials applied to the terminals 8 and 9 are applied to the gate 16 and to the gates 17 and 18 respectively. The terminals 8 and 9 are also connected via respective switches 6 and 7 to respective inputs of an OR gate 19 whose output is operative to trigger a monostable multivibrator 20 the output of which is connected to one input of an AND gate 21 the other input of which is provided by a sync comparator 22 which is operative to compare the sync waveform in the video signal with the line flyback and provides a high output level when they are synchronised. The AND gate 21 have an output which is connected to provide a second input for each of the NOR gates 12 and 13.

When an operator desires to change channels he presses one of the two push button switches 6 and 7 in dependence upon whether he wishes to move upwards or downwards through available channels. For the sake of simplicity of description it will be assumed that the button 6 is pressed to effect an upward sweep. The pressing of push button 6 is operative to connect the potential applied to the terminal 8 to the SET input of the flip-flop 10 to cause this flip-flop to enter the SET state in which the Q output is logical '0'. The flip-flop 11 is simultaneously RESET and Q output of this flip-flop becomes logical '1' and the NOR gate 13 is blocked. The potential at the terminal 8 is also applied on depression on the switch 6 via the OR gate 19 to trigger monostable multivibrator 20. When triggered the output of the monostable 20 which is normally high goes low for a period which depends on its time constant and this low output is effective during this period to block the AND gate 21 whose output becomes logical '0'. The logical '0' appearing at the output of the AND gate 21 is applied to both the NOR gates 12 and 13 and causes the gate 12 whose other input receives the Q output from the flip-flop 10 which is also at logical '0', to assume a logical '1' condition. With the switch 14 SET into its automatic channel sweep condition the output of the gate 12 is applied via the OR gate 16 to the channel sweep input 3 of the frequency synthesizer unit 2 and causes this unit to commence channel sweeping. The output of the NOR gate 12 is also passed via the OR gate 17 to the UP control input 4 of the synthesizer unit 2 to indicate an upward sweep is required.

When an available channel is received the line flyback and the sync wave form in the video signal become synchronised and the sync comparator 22 provides a logical '1' output level. The monostable 20 will by this time have completed its trigger cycle and returned to a high output level and therefore the AND gate 21 will receive high levels at both its inputs and will therefore pass a logical '1' to the inputs of the gates 12 and 13 which will be blocked and therefore provide a logical '0' output. This is communicated to the gate 16 via switch 14 and the gate 16 whose other input is already SET at logical '0' is blocked. This is effective to stop the sweeping of the synthesizer unit 2. The operation is exactly analagose when the switch 7 is depressed to effect a downward sweeping. Manually controlled channel sweeping may still be effected by changing the position of the switches 14 and 15 to the manual position in which case the flip-flops 10 and 11 AND gates 12 and 13 are by-passed and the switches 6 and 7 are connected directly to the control inputs 3, 4 and 5 of the synthesizer unit 2 via the gates 16, 17 and 18 so that channel sweeping will be maintained whilst a selected push button is held in the depressed position.

To effect fine tuning I.F. signals are passed through an automatic frequency control (AFC) discriminator which provides an output whose level varies in dependence upon the frequency of the I.F. signals and hence in dependence upon the frequency of received signals. The AFC discriminator 23 provides an output which is connected to the positive input of a level comparator 24 and to the negative input of a further level comparator 25. The comparator 24 receives a second input from the wiper of a pre-set potentiometer 34 whilst the comparator 25 in similar manner receives a second input from the wiper of a pre-set potentiometer 35. The comparators 24 and 25 compare the signals provided by the AFC discriminator 23 with the applied pre-set potentials with the effect that the output of the comparator 24 goes to a high level whenever the signal level provided by the discriminator 23 differs from the pre-set level provides by the potentiometer 34 by a predetermined amount in one direction, which as indicated in the drawings will be the upward direction, whilst the level comparator 25 has an output which goes high whenever the output provided by the discriminator 23 differs from that of the pre-set potentiometer 25 by a predetermined amount in the opposite downward direction.

The output of the comparator 24 is connected to one input of and AND gate 26 whose output is connected in one position of a two position switch 28 to a second input of the OR gate 17. The comparator 25 has an output which is connected to one input of AND gate 27 whose output is connected in one position of a two position switch 29 to a second input of the AND gate 18. In a second position of the switch 28 the second input of the gate 17 is connected via an operator controlled switch 30 to a terminal 32 which receives a fixed potential whilst in a second position of the switch 29 a similar potential applied to a terminal 33 is connected via a switch 31 to a second of the inputs of the gate 18. A second input for each of the AND gates 26 and 27 is provided by the output of the gate 21.

During channel sweeping and until such times as a channel is received the sync comparator 22 will provide a low, that is logical '0' output level and this will be effective to block the AND gate 21 whose output will be SET at logical '0'. This logical '0' being applied to one input of each of the AND gates 26 and 27 will be operative to block both those gates. Fine tuning control signals provided by the level comparator 24 and 25 will not therefore be passed to the up and down control inputs 4 and 5 one of which at this time will be receiving a signal indicating the direction of sweeping as previously described. When a channel is received the sync comparator 22 will provide a logical '1' output which will be effective to unblock the gate 21. The second input to the gate 21 provided by the monostable 20 will at this time be high and therefore the gate 21 will provide a logical '1' output which will be effective to unblock the gates 26 and 27. The fine control will therefore automatically become operative on cessation of sweeping and control signals will be passed from the comparators 24 and 25 via the gates 17 and 18 to the up and down fine tuning control inputs 4 and 5 respectively which will not now be receiving sweep up or sweep down controls as sweeping will have been completed and the gates 12 and 13 will be blocked. The synthesizer unit 2 will therefore be automatically controlled to maintain the local oscillator in tune with the received signal.

Manual fine tuning can be obtained by changing over the switches 28 and 29 to the second and manual control position in which case fine tuning can be effected if one or other of the switches 30 and 31 is maintained depressed.

This invention has been described with reference to the drawings by way of example only and many modifications may be made without departing from the scope of the invention. For example although a television receiver has been described it is possible to apply this invention to any receiver. However although the frequency synthesizer unit 2 is conveniently provided by that described in our above reference co-pending application this need not be the case and any suitable frequency synthesizer unit may be used.

What we claim is:

1. A receiver comprising a frequency synthesizer controlled channel selection means which includes a controllable oscillator having a frequency and providing an output signal, dividing means including an adjustable divider for dividing the output signal to obtain a divided output signal, a reference signal source for providing a reference signal, a comparator for comparing the reference signal with the divided output signal and for providing a control signal to control the controllable oscillator, fine tuning means for fine tuning the frequency of the controllable oscillator, means for initiating a sweep of available channels by the channel selection means, means for stopping the sweep on reception of a signal by said receiver on one of the available channels, and control means operable on cessation of sweeping and responsive to the frequency of the signal for controlling the fine tuning means to compensate for frequency drift of the signal.

2. A receiver as claimed in claim 1 wherein the receiver is a television receiver.

3. A receiver as claimed in any one of claims 1 or 2 wherein the control means comprises level detector means for receiving a frequency representative signal having a level which is representative of the frequency of the received signal so as to monitor frequency drift of said received signal, and for providing an output signal when a predetermined frequency drift is detected.

4. A receiver as claimed in claim 3 wherein two level comparators are provided, each of said two level comparators receiving the frequency representative signal and a respective reference level and providing an output representative of an upward and downward frequency drift, respectively, exceeding predetermined limits.

5. A receiver as claimed in claim 4 wherein the frequency representative signal is provided by automatic frequency control (A.F.C.) means for automatically controlling the frequency of the received signal.

6. A receiver as claimed in claim 5 wherein the automatic frequency control means comprises an A.F.C. discriminator.

7. A receiver as claimed in claim 3 wherein the frequency representative signal is provided by automatic frequency control (A.F.C.) means for automatically controlling the frequency of the received signal.

8. A receiver as claimed in claim 3 wherein the control means controls the fine tuning means via a signal path which includes blocking means for blocking said signal path until said signal is received.

9. A receiver as claimed in claim 3 wherein said channel selection means has a control input, and the means for initiating the sweep comprises an operator control coupled to the control input of the channel selection means, and the means for stopping the sweep is operative to isolate the operator control from the control input of the channel selection means.

10. A receiver as claimed in claim 3 wherein the means for stopping the sweep includes detecting means for detecting the reception of said signal.

11. A receiver as claimed in claim 10 wherein the detecting means comprises a synch comparator operative to compare video signals with line flyback signals and to provide an output signal having a level indicative of the reception of said signal.

12. A receiver as claimed in claim 1 wherein the control means controls the fine tuning means via a signal path which includes blocking means for blocking said signal path until said signal is received.

13. A receiver as claimed in claim 12 wherein the blocking means comprises gate means connected to said signal path and receiving, as a second input, a reception signal indicative of the reception of said signal.

14. A receiver as claimed in claim 1 wherein said channel selection means has a control input, and the means for initiating the sweep comprises an operator control coupled to the control input of the channel selection means, and the means for stopping the sweep is operative to isolate the operator control from the control input of the channel selector means.

15. A receiver as claimed in claim 14 wherein the operator control is coupled to the channel selection means via gating means operative for opening on operation of the operator control.

16. A receiver as claimed in claim 15 wherein the means for stopping the sweep is arranged to provide a blocking signal operative to block the gating means on receipt of said signal.

17. A receiver as claimed in claim 1 wherein the means for stopping the sweep includes detecting means for detecting the reception of said signal.

18. A receiver as claimed in any one of claims 2 or 17 wherein the detecting means comprises a synch comparator operative to compare video signals with line flyback signals and to provide an output signal having a level indicative of the reception of said signal.

* * * * *